United States Patent [19]

Proksa et al.

[11] Patent Number: 5,004,983

[45] Date of Patent: Apr. 2, 1991

[54] CIRCUIT ARRANGEMENT FOR GENERATING RF SIGNALS FOR MR EXAMINATIONS

[75] Inventors: Roland Proksa; Peter Roschmann, both of Hamburg, Fed. Rep. of Germany; Noel J. M. van den Berg, Zoetermeer, Netherlands

[73] Assignee: U.S. Philips Corporation, New York, N.Y.

[21] Appl. No.: 359,620

[22] Filed: Jun. 1, 1989

[30] Foreign Application Priority Data

Jun. 30, 1988 [DE] Fed. Rep. of Germany ....... 3821984

[51] Int. Cl.$^5$ ............................................. G01R 33/20
[52] U.S. Cl. .................................................. 324/322
[58] Field of Search ................. 324/77 R, 77 B, 77 D, 324/78 R, 78 D, 300, 307, 308, 309, 310, 311, 312, 313

[56] References Cited

U.S. PATENT DOCUMENTS 4,054,785 10/1977 Lehmann .......................... 324/77 D
4,613,814 9/1986 Penney ............................. 324/77 B Primary Examiner—Michael J. Tokar
Attorney, Agent, or Firm—Jack D. Slobod

[57] ABSTRACT

The invention relates to a circuit arrangement for generating rf signals for MR examinations, comprising a read-only memory in which a signal is stored in the form of a series of data words, an address generator for reading data words from the read-only memory with a clock frequency, and a digital-to-analog converter which succeeds the read-only memory. In order to reduce the required storage capacity, a sinusoidal signal in the form of a series of data words is stored in the memory.

20 Claims, 2 Drawing Sheets

CIRCUIT ARRANGEMENT FOR GENERATING RF SIGNALS FOR MR EXAMINATIONS

BACKGROUND OF THE INVENTION

1. Field of the Invention

The invention relates to a circuit arrangement for generating rf signals for MR examinations, comprising a read-only memory in which a signal is stored in the form of a series of data words, an address generator for reading data words from the read-only memory with a clock frequency, and a digital-to-analog converter which succeeds the read-only memory.

2. Prior Art

Such a circuit arrangement is essentially known from the magazine "Neues aus der Technik", No. 1, Feb. 15, 1984, page 4, contribution 771. Circuit arrangements of this kind serve for generating rf pulses for MR examinations, for example for so-called MR tomography. During such examinations an rf oscillation is applied for some ms; the frequency, the phase or the amplitude of this rf oscillation may be modulated. The frequency of this oscillation is predetermined by the Larmor frequency which itself is determined by the flux density of the steady magnetic field generated in the MRI apparatus.

In the known circuit arrangement the variation of the complete rf pulse is stored in a fast digital memory. When it is constructed as a read-only memory such a memory must have a very high storage capacity, notably because a multitude of rf pulses having a different variation in time must be generated in an MRI apparatus.

SUMMARY OF THE INVENTION

It is the object of the invention to construct a circuit arrangement of the kind set forth so that an rf pulse can be generated without it being necessary to store its entire variation in time in the read-only memory.

This object is achieved in accordance with the invention in that a sinusoidal waveform in the form of a series of data words is stored in the read-only memory, such that the spectrum at the output of the digital-to-analog converter comprises a spectral line having a Larmor frequency $f_L$ required for the MR examination. Thus, in accordance with the invention only one sinusoidal waveform is stored in the memory; it suffices when only one quarter period of such a waveform is stored as a series of data words, the rf pulse which consists of a multitude of sinusoidal oscillations being generated in that the address space assigned to the sinusoidal waveform is traversed repeatedly.

An analog-to-digital converter customarily operates at a clock frequency which amounts to at least twice the frequency of the analog signal to be generated thereby. The frequency thereof, being the so-called Larmor frequency amounts to more than 5 MHz, even in MRI apparatus having a steady magnetic field of only 0.15 T, so that the clock frequency of the digital-to-analog converter should be more than 10 MHz. In MRI apparatus involving a stronger magnetic field, the clock frequency for the digital-to-analog converter must be higher accordingly. Moreover, a high resolution is required for such a converter. These conditions can be satisfied only when it is capable of processing data words having a word width of at least 12 bits. A digital-to-analog converter for clock frequencies in excess of 10 MHz and data word widths of at least 12 bits can be realised, if at all possible, only with great difficulty.

In order to solve this problem, in the previous, non-prepublished European Patent Application No. 88200981.4 corresponding to commonly owned U.S. patent application Ser. No. 196,534, filed May 19, 1988, it is proposed to increase the frequency of the output signal of the digital-to-analog converter to the desired value by means of a subsequent mixer which mixes the analog output signal of the converter with another signal having a constant frequency. The expenditure for the digital-to-analog converter is thus reduced because it can operate at a comparatively low clock frequency, but the expenditure for analog signal processing is substantially increased.

In a further embodiment of the invention, this problem is solved in that the clock frequency $f_T$ and the frequency $f_S$ of the cycles of the sinusoidal waveform read from the read-only memory are chosen so that:

$$f_L = nf_T + af_S.$$

where $f_L$ is the Larmor frequency required for the MR examination, "n" is a positive integer larger than zero, and "a" has the value $+1$ or $-1$.

The invention utilises the fact that a sinusoidal digital signal on the output of a digital-to-analog converter produces a spectrum which forms, in addition to a line having the same frequency as the digital signal, side lines on both sides of the clock frequency or the harmonics of the clock frequency, the frequency distance between said side lines and the clock frequency or the harmonics of the clock frequency corresponding to the frequency of the digital signal. Thus, rf signals having a frequency which is higher than the clock frequency of the digital-to-analog converter can be generated. It is no longer necessary to transpose the signal frequency to a higher value in the analog processing section.

For MR examinations it is desirable to vary the frequency of the rf pulses by amounts equal to 1 Hz or even less. In relation to the Larmor frequency, amounting to at least a few MHz, this represents a frequency variation of $10^{-7}$. Such a frequency resolution can be achieved when the read-only memory has a storage capacity of, for example 16M words.

In order to reduce the requirements imposed as regards the storage capacity of the read-only memory, in a further embodiment of the invention the address generator comprises a counting device whose counting position can be changed by a presettable amount with the clock frequency, the counting capacity of the counting device being a multiple of the number of addressable storage locations in the read-only memory, the address signal for the read-only memory being derived from the most-significant bit positions of the output signal of the counting device. The frequency resolution is then determined by the word width used in the counting device. Thus, if the counting device is designed for a word width of 24 bits, the desired frequency resolution will not be affected by using a memory having a storage capacity of 64k words the addressing of which requires only the 16 most-significant bits of the output signal of the counting device.

Various MR examinations require a phase-coherent frequency variation. This means that when the frequency of the rf signal is switched to a different value during an MR examination and is subsequently restored to the original value again, its phase should assume the value which it would have if the switching back and forth of the frequency were omitted.

For phase-coherent frequency variation in a further embodiment of the invention the address generator comprises a counting device whose counting position can be varied by a presettable amount with the clock frequency, between the counting device and the read-only memory there being provided a multiplier circuit in which the counting position is each time multiplied by a presettable factor. In this embodiment the counting position is independent of the frequency, so that the phase determined by the counting position is not influenced by a frequency variation.

BRIEF DESCRIPTION OF THE DRAWING

The invention will be described in detail hereinafter with reference to the drawings. Therein.

DETAILED DESCRIPTION OF THE PREFERRED EMBODIMENTS

Figure 1:
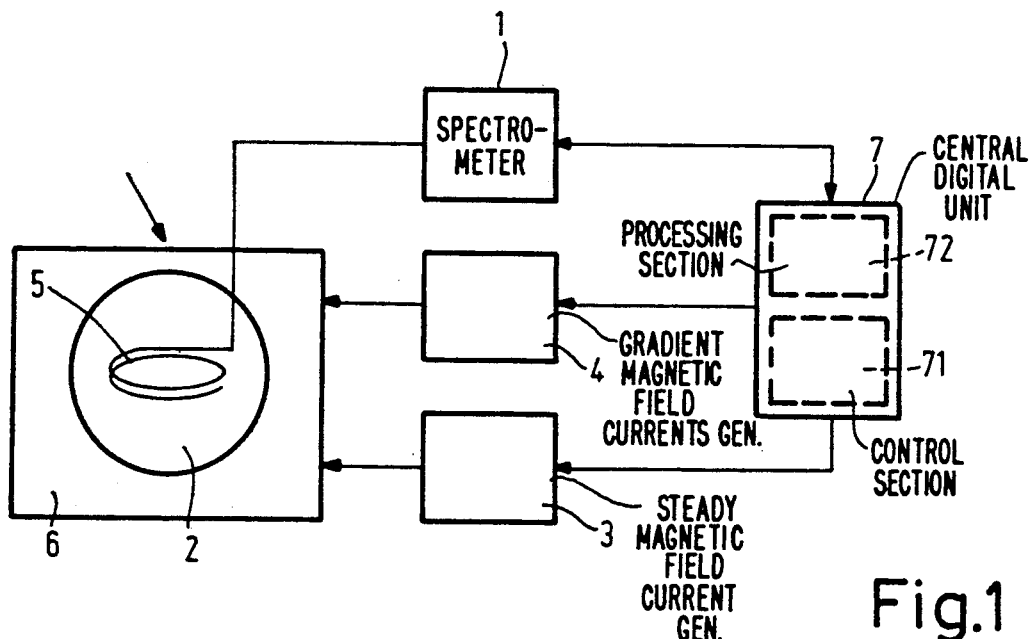
FIG. 1 shows an MR tomography apparatus in which the invention can be used.

The reference numeral 6 in FIG. 1 denotes a device which generates a uniform, steady magnetic field of, for example 0.16 T, extending perpendicularly with respect to the plane of drawing, in an examination zone 2 and which also generates, when necessary, magnetic gradient fields, i.e. magnetic fields which extend in the same direction as the steady, uniform magnetic field but whose strength varies linearly in the direction of the magnetic field or in a direction perpendicular thereto. To achieve this, the device 6 is coupled to a generator 3 which generates the steady magnetic field and a generator 4 supplies currents for the various magnetic gradient fields.

There is also provided an rf coil 5 which generates an rf magnetic field which extends perpendicularly with respect to the steady field and which is connected to the output of a spectrometer 1. The spectrometer comprises a transmitter section in which the rf signals for the MR examinations are generated and a receiver section in which the spin resonance signals generated in the examination zone are received and processed. For said field strength of 0.16 T, the frequency of the rf signals generated by the transmitter section and of the spin resonance signals produced in the examination zone amounts to 6.8 MHz.

The generators 3 and 4 and the spectrometer 1 are controlled by a central digital unit 7 which comprises a control section 71 for this purpose. The central digital unit also comprises a processing section 72 which processes the data supplied by the spectrometer 1 and which reconstructs the nuclear magnetisation distribution in the examination zone 2 therefrom.

Figure 2:
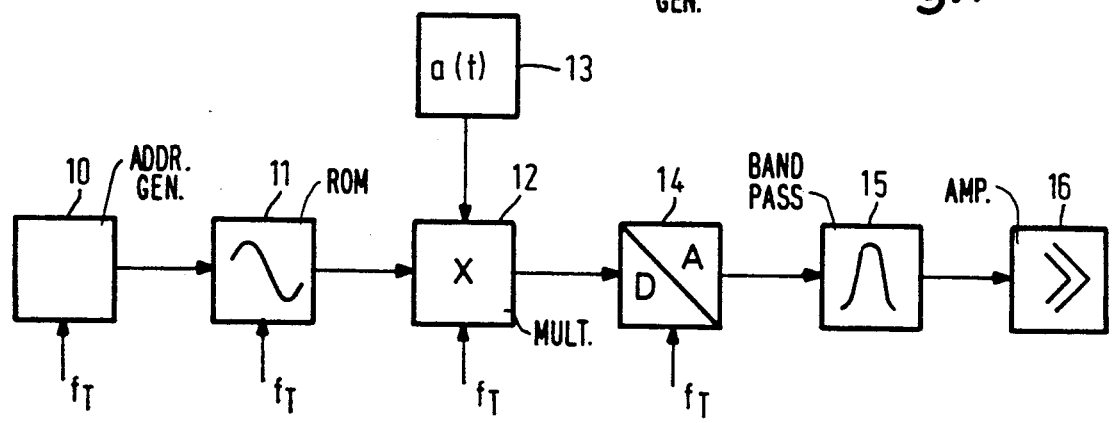
FIG. 2 shows the block diagram of a circuit arrangement in accordance with the invention.

FIG. 2 shows a block diagram of the transmitter section of the spectrometer 1. The reference numeral 10 in FIG. 2 denotes an address generator which generates, under the control of a clock frequency $f_T$, an address signal in the form of a linearly ascending sequence of digital numbers. When a maximum value is reached, the address signal returns to an initial value, after which the address signal linearly ascends again to the maximum value, etc. The address generator 10 thus supplies of its output a sequence of digital numbers corresponding to a sawtooth digital address signal.

16 binary digits of this sawtooth address signal serve as the address for a read-only memory 11 (PROM) in which a sinusoidal waveform is stored and which has a storage capacity of $2^{16}$ data words having a word width of 16 bits each. Between the address signal x on the input of the read-only memory 11 and its output signal y the following relation exists:

$$y = \text{Int}\,(c.\sin\,(x/b)).$$

Therein, "." indicates multiplication, "Int ( )" denotes the rounded, integer part of the expression between parentheses, c denotes the maximum value which can be stored in the memory 11 ($2^{16}$) and "b" is a constant which is a factor $2\pi$ smaller than "c". Thus, the read-only memory converts the periodic sawtooth digital address signal on its input into a periodic sinusoidal digital signal.

It is not necessary to store the variation of a complete sinusoidal waveform in the memory; it suffices when only one quarter cycle of such a sinusoidal waveform is stored. In dependence of the two most significant bits on the address input of the memory, the stored quarter period of the sinusoidal oscillation is traversed in an ascending or a descending manner with a positive or a negative sign. The storage capacity required is thus reduced to one quarter; however, the addressing sequence and/or the polarity must be reversed in dependence of the two most significant bits.

The frequency and the phase of the sinusoidal output signal of the read-only memory 11 thus generated can be preset, because the frequency and the phase of the address signal generated by the address generator 10 are presettable. This will be explained with reference to FIG. 3 which shows a block diagram of the address generator 10.

Figure 3:
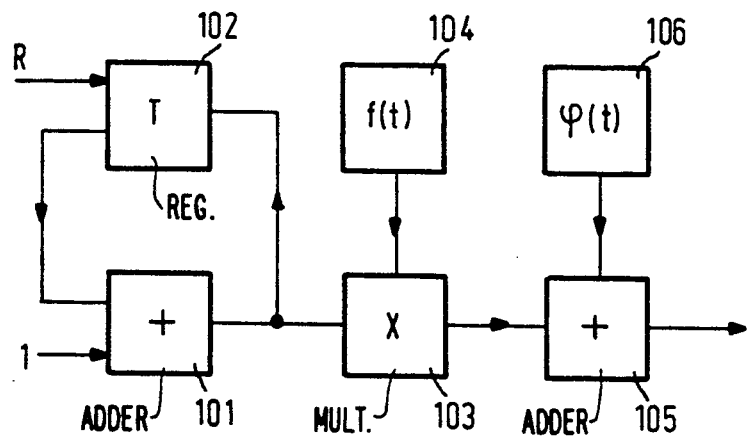
FIG. 3 shows the block diagram of an address generator suitable for such a circuit arrangement.

As appears from FIG. 3, the address generator comprises among other things a counting device which consists of an adding circuit 101 and a register 102, both of which are designed for a word width of 24 bits. The output of the adding circuit 101 is fed back to one of its adding inputs via the register 102. A constant value, preferably the value 1, is present on a second adding input. Thus, the counting position is incremented by 1 in response to each beat of the clock frequency $f_T$. The counting process can be started in a defined phase position by way of a pulse on the rest input R of the register 102.

The output signal of the adding circuit 101 is applied to a multiplier stage 103 in which it is multiplied by a factor which is supplied by a circuit 104 and which may also have a width of 24 bits. The frequency of the sawtooth signal or the sinusoidal signal is directly proportional to the factor supplied by the circuit 104. When this factor amounts to approximately 6 040 000, the sawtooth signal has a frequency of approximately 1.8 MHz. A variation of the factor by the amount 1 causes a frequency variation of 0.298 Hz.

Various MRI methods utilise frequency modulated rf pulses. In that case the factor supplied by the circuit 104 may not be constant, but must vary in the same way as the desired frequency. To this end, the circuit 104 may comprise a memory in which the desired frequency variation is stored as a series of data words. Because the frequency variation of a frequency modulated oscillation is small in comparison with the Larmor frequency for MR examinations, the memory required for this purpose may have a comparatively small storage capacity.

Only 16 bits of the 48 bits forming the multiplication result are processed, that is to say the 16 most significant bits of the 24 least-significant bits. These bits are applied to an adding circuit 105 in which a constant value is added to the output signal 103, said constant value defining the phase of the sawtooth signal and hence also that of the sinusoidal signal on the output of the read-only memory 11. In order to generate a phase modulated signal, this addend may also be variable in time, if desired. Even though the memory 11 comprises only $2^{16}$ storage locations, the frequency resolution is given by the word width of the counting device; amounts to $2^{-24} f_T$.

The individual components of the address generator 10, but also of the other digital circuits in the block diagram shown in FIG. 2, process the digital signals during a period of time which is no longer negligibly short in comparison with the clock period (200 ns). Therefore, a buffer memory is preferably connected subsequent to these components, including notably the multiplier 103, so that the subsequent circuit derives its input quantity from the buffer memory. These buffer memories, however, have been omitted for the sake of clarity of the FIGS. 2 and 3.

Because only 16 bits of the result of the multiplier circuit 103 influence the address generator 11, a single address of the address generator 11 may be each time associated with a plurality of counting positions of the counting device 11, 102; moreover, the address space is usually traversed with different begin addresses and end addresses. As a result, a period of the output signal is substantially longer than twice the time interval between two zero positions. This increased periodicity has a positive effect, because the noise components introduced by the finite arithmetical precision are spread over a wider band of the spectrum. This means that the interference frequencies resulting from discretisation will have a lower intensity and partly disappear in broadband noise.

The digital sinusoidal output signal of the read-only memory 11 is applied to a further multiplier circuit 12 in which it is multiplied by a factor which is derived from a waveform generator 13. This factor determines the amplitude of the signal. Because this factor is not constant in the case of amplitude modulated signals, the waveform or the envelope of the signal is preferably derived as a series of data words from a memory included in the waveform generator 13. The twelve most significant bits of the output signal of the multiplier circuit 12 are applied to a 12-bit digital-to-analog converter 14 which converts the digital signal applied to its input in the form of a series of data words into an analog signal.

Figure 4:
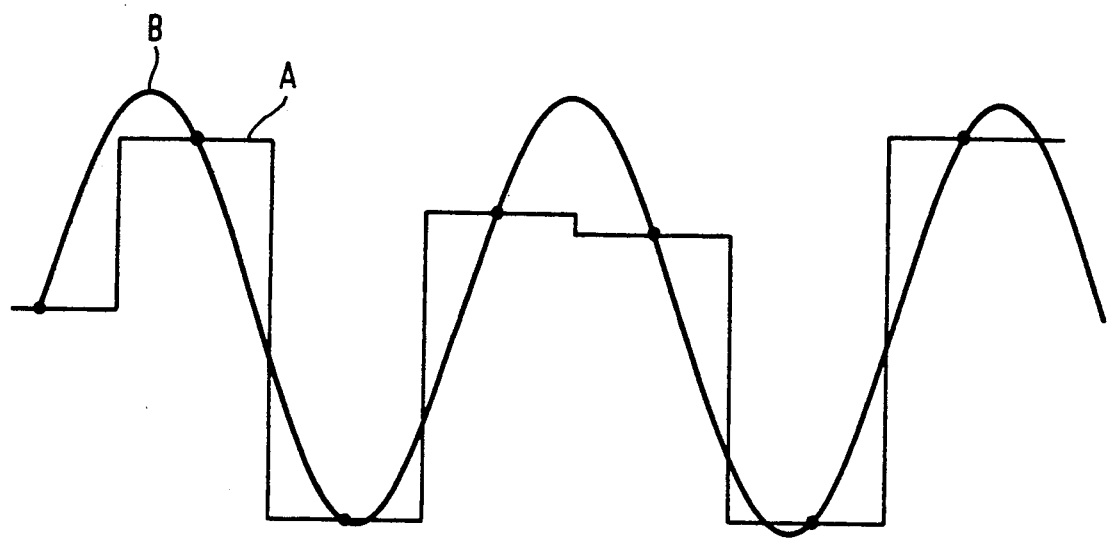
FIG. 4 shows the variation in time of the output signal of the digital-to-analog converter.

FIG. 4 shows the resultant analog signal A. It appears that the sinusoidal signal is approximated by means of only a comparatively small number of sample points (for a clock frequency $f_T$ of 5 MHz and a signal frequency $f_S$ of 1.8 MHz, 2.78 sample points per oscillation occur on time average). For comparison, the reference B denotes the sinusoidal signal which would be obtained if the sample points were to succeed one another in an infinitely close manner. It appears that the sinusoidal signal B always intersects the stepped signal A in the centre of a step and also that a period of the signal A is not identical to a period of the signal B (i.e. it is substantially longer as has already been explained).

Figure 5:
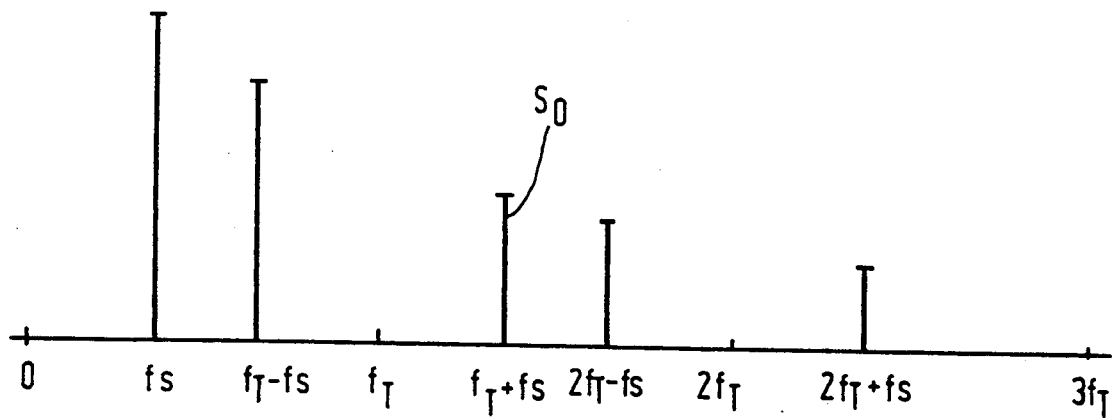
FIG. 5 shows the spectrum on the output of the digital-to-analog converter.

The spectrum of the output signal A of the digital-to-analog converter 14 is shown in FIG. 5. This spectrum comprises first of all a line at the frequency $f_S$. This is the frequency of the sinusoidal signal B or the frequency at which the address generator 10 runs through the addresses of the read-only memory 11. In addition, on both sides of the clock frequency $f_T$ and its higher harmonics there are side lines whose frequency distance from the clock frequency or the harmonics thereof corresponds to the frequency $f_S$. The upper side line $S_0$ of the clock frequency has a frequency $f_T+f_s$ (6.8 MHz) which corresponds to the Larmor frequency of an MRI apparatus having a magnetic field of 0.16 T.

It appears from the FIGS. 4 and 5 that the frequency $f_S$ must be less than half the clock frequency (i.e. less than 2.5 MHz in the present example) in order to ensure that each sinusoidal oscillation is represented by at least two sample points. On the other hand, the amplitude of the side lines decreases as the frequency increases.

The value of $f_S$ (1.8 MHz) selected in the embodiment in accordance with the invention does not reach this theoretical value ($f_T/2=2.5$ MHz) but, using comparatively simple filter means it enables the base line $f_S$ as well as the other side lines, notably the lower side line of the second harmonics, to be suppressed sufficiently.

Because of their comparatively large frequency distance the base lines and the other side lines do not influence the nuclear spins in the examination zone. However, they are amplified by the amplifier 16 and increase the loss power thereof, without improving the diagnostically relevant information. Therefore the digital-to-analog converter 14 is succeeded by a bandpass filter 15 which is tuned to the upper sideband S0 of the clock frequency $f_T$; it conducts the normally suppressed side line S0 and suppresses the base line, customarily used as an analog signal, as well as all other side lines. The output signal of the filter is amplified by the power amplifier 16 in order to be applied to the coil 5 (FIG. 1).

We claim:

1. A circuit arrangement for generating rf signals at a Larmor frequency "$f_L$" for transmission into an examination zone during MR examinations, comprising a read-only memory in which samples of a sinusoidal waveform are stored in the form of a series of data words, an address generator means for reading data words from the read-only memory with a clock frequency "$f_T$" such that cycles of the sinusoidal waveform are read out from said read-only memory with a frequency "$f_S$", there being at least two data words read from the read-only memory for each cycle of the sinusoidal waveform, and a digital-to-analog converter which succeeds the read-only memory, wherein "$f_T$" and "$f_S$" are chosen such that a frequency spectrum at the output of the digital-to-analog converter comprises a spectral line at the Larmor frequency $f_L$, and wherein $f_L > f_S$.

2. A circuit arrangement as claimed in claim 1, wherein the clock frequency "$f_T$" and the frequency "$f_S$" of reading cycles of the sinusoidal waveform from the read-only memory are chosen so that:

$$f_L = nf_T + af_S$$

where "n" is a positive integer larger than zero, and "a" has the value +1 or −1.

3. A circuit arrangement as claimed in claim 1, characterized in that the address generator comprises a counting device whose counting position can be changed by a presettable amount with the clock frequency, the counting capacity of the counting device being a multiple of the number of addressable memory locations in the read-only memory, an address signal for the read-only memory being derived from an bits of a part of the output signal of the counting device.

4. A circuit arrangement as claimed in claim 1, characterized in that the address generator comprises a counting device (101, 102) whose counting position can be varied by a presettable amount with the clock frequency, between the counting device and the read-only memory (11) there being connected a multiplier circuit (103) in which the counting position is each time multiplied by a presettable factor (f(t)).

5. A circuit arrangement as claimed in claim 1, characterized in that between the read-only memory (11) and the digital-to-analog converter (14) there is connected a multiplier circuit (12) which multiplies the data words read from the read-only memory by a presettable factor (a(t)).

6. A circuit arrangement as claimed in claim 1, characterized in that a last stage of the address generator is formed by an adder circuit (105).

7. A circuit arrangement as claimed in claim 3, characterized in that the counting device comprises an adding circuit (101) whose output is connected, via a memory (102), to one input of the adding circuit, a constant value being present on a second input of the adding circuit.

8. A circuit arrangement as claimed in claim 2, characterized in that the address generator comprises a counting device whose counting position can be changed by a presettable amount with the clock frequency, the counting capacity of the counting device being a multiple of the number of addressable memory locations in the read-only memory, an address signal for the read-only memory being derived from the bits of a part of an output signal of the counting device.

9. A circuit arrangement as claimed in claim 2, characterized in that the address generator comprises a counting device (101, 102) whose counting position can be varied by a presettable amount with the clock frequency, between the counting device and the read-only memory (11) there being connected a multiplier circuit (103) in which the counting position is each time multiplied by a presettable factor (f(t)).

10. A circuit arrangement as claimed in claim 8, characterized in that the address generator comprises a counting device (101, 102) whose counting position can be varied by a presettable amount with the clock frequency, between the counting device and the read-only memory (11) there being connected a multiplier circuit (103) in which the counting position is each time multiplied by a presettable factor (f(t)).

11. A circuit arrangement as claimed in claim 2, characterized in that between the read-only memory (11) and the digital-to-analog converter (14) there is connected a multiplier circuit (12) which multiplies the data words read from the read-only memory by a presettable factor (a(t)).

12. A circuit arrangement as claimed in claim 3, characterized in that between the read-only memory (11) and the digital-to-analog converter (14) there is connected a multiplier circuit (12) which multiplies the data words read from the read-only memory by a presettable factor (a(t)).

13. A circuit arrangement as claimed in claim 4, characterized in that between the read-only memory (11) and the digital-to-analog converter (14) there is connected a multiplier circuit (12) which multiplies the data words read from the read-only memory by a presettable factor (a(t)).

14. A circuit arrangement as claimed in claim 10, characterized in that between the read-only memory (11) and the digital-to-analog converter (14) there is connected a multiplier circuit (12) which multiplies the data words read from the read-only memory by a presettable factor (a(t)).

15. A circuit arrangement as claimed in claim 2, characterized in that a last stage of the address generator is formed by an adder circuit (105).

16. A circuit arrangement as claimed in claim 3, characterized in that a last stage of the address generator is formed by an adder circuit (105).

17. A circuit arrangement as claimed in claim 4, characterized in that a last stage of the address generator is formed by an adder circuit (105).

18. A circuit arrangement as claimed in claim 14, characterized in that a last stage of the address generator is formed by an adder circuit (105).

19. A circuit arrangement as claimed in claim 4, characterized in that the output is connected, via a memory (102), to one input of the adding circuit, a constant value being present on a second input of the adding circuit.

20. A circuit arrangement as claimed in claim 18, characterized in that the output is connected, via a memory (102), to one input of the adding circuit, a constant value being present on a second input of the adding circuit.

* * * * *